US011600329B1

(12) United States Patent
Ray

(10) Patent No.: US 11,600,329 B1
(45) Date of Patent: Mar. 7, 2023

(54) SYSTEMS AND METHODS FOR RUNTIME ANALOG SANITIZATION OF MEMORY

(71) Applicant: Biswajit Ray, Madison, AL (US)

(72) Inventor: Biswajit Ray, Madison, AL (US)

(73) Assignee: Board of Trustees of the University of Alabama, for and on behalf of the University of Alabama in Huntsville, Huntsville, AL (US)

( * ) Notice: Subject to any disclaimer, the term of this patent is extended or adjusted under 35 U.S.C. 154(b) by 0 days.

(21) Appl. No.: 17/207,260

(22) Filed: Mar. 19, 2021

Related U.S. Application Data

(63) Continuation-in-part of application No. 16/809,191, filed on Mar. 4, 2020, now Pat. No. 11,177,003.
(Continued)

(51) Int. Cl.
*G11C 16/00* (2006.01)
*G11C 16/10* (2006.01)
(Continued)

(52) U.S. Cl.
CPC .......... *G11C 16/10* (2013.01); *G11C 16/0483* (2013.01); *G11C 16/26* (2013.01)

(58) Field of Classification Search
CPC ................ G11C 16/10; G11C 11/5628; G11C 16/3427; G11C 16/3459; G11C 16/0408; G11C 16/0458; G11C 16/3418; G11C 2211/562; G11C 2211/5622; G11C 2211/5642; G11C 2211/5648; G11C 16/3454; G11C 16/0483; G11C 11/5621; G11C 2211/5621; G11C 16/24; G11C 16/26; G11C 11/5642; G11C 11/5671; G11C 16/08; G11C 16/12; G11C 16/32; G11C 16/34; G11C 2029/0409; G11C 2029/1202; G11C 2029/1204; G11C 2211/5644; G11C 29/023; G11C 29/025; G11C 29/028; G11C 29/12005; G11C 29/12015; G11C 7/222; G11C 16/06; G11C 16/3404; G11C 16/349
(Continued)

(56) References Cited

U.S. PATENT DOCUMENTS

2010/0124108 A1* 5/2010 Sarin .................. G11C 16/0408
365/189.05

* cited by examiner

Primary Examiner — Thong Q Le
(74) Attorney, Agent, or Firm — Maynard Cooper & Gale, P.C.; Jon E. Holland

(57) ABSTRACT

A system performs analog memory sanitization by forcing voltage levels in memory cells to substantially the same voltage level so that they are indistinguishable regardless of the data that has been previously stored in the cells. In some embodiments, a special programming operation for sanitizing a plurality of memory cells forces the charge in the cells to approximately the same voltage level by increasing the voltage level of all cells regardless of the data currently stored in the cells. As an example, each cell may be programmed to a logical high bit value (e.g., a "0") by increasing the charge in each cell to a voltage level that is greater than the voltage level for writing the same logical bit value in a normal programming operation. Thus, after the programming operation is performed, the voltage levels of cells storing one logical bit value (e.g., a "0") prior to the programming operation may be indistinguishable from voltage levels of cells storing a different logical bit value (e.g., a "1") prior to the programming operation.

7 Claims, 7 Drawing Sheets

Related U.S. Application Data

(60) Provisional application No. 62/991,794, filed on Mar. 19, 2020, provisional application No. 62/813,494, filed on Mar. 4, 2019.

(51) Int. Cl.
*G11C 16/26* (2006.01)
*G11C 16/04* (2006.01)

(58) Field of Classification Search
USPC ............ 365/185.19, 185.03, 185.18, 185.22, 365/185.24, 185.02, 189.05; 345/76
See application file for complete search history.

US 11,600,329 B1

SYSTEMS AND METHODS FOR RUNTIME ANALOG SANITIZATION OF MEMORY

CROSS REFERENCE TO RELATED APPLICATION

This application is a continuation-in-part of U.S. application Ser. No. 16/809,191, entitled "Systems and Methods for Runtime Analog Sanitation of Memory" and filed on Mar. 4, 2020, which is incorporated herein by reference. This application also claims priority to U.S. Provisional Application No. 62/991,794, entitled "Ensuring Privacy by Runtime Analog Sanitization of Solid-State Storage Device" and filed on Mar. 19, 2020, which is incorporated herein by reference. U.S. application Ser. No. 16/809,191 application claims priority to U.S. Provisional Patent Application No. 62/813,494, entitled "Data Recovery from 'Scrubbed' NAND Flash Storage: Need for Analog Sanitization" and filed on Mar. 4, 2019, which is incorporated herein by reference.

RELATED ART

Memory is an important element in a variety of electronic and computer applications. Memory may include volatile and nonvolatile memory. Volatile memory usually loses the data stored therein with a loss of power. Nonvolatile memory can preserve information even after power cycling.

Nonvolatile memory provides a great number of useful purposes, but can become a security concern when it comes time to disposal of data or disposal of the memory system itself. Many second-hand nonvolatile memory systems have been found to contain sensitive and confidential information about businesses, individuals, and government interests after being sold to third parties. Even memory systems thought to have been erased have been found to have sensitive and confidential information recoverable on them.

NAND flash memory is generally a very popular commercial nonvolatile memory (NVM) option due to its high density (greater than 1 terabyte (TB)/square inch) along with its relatively low cost (less than $1/gigabyte (GB)), lightweight and low power consumption, making it very attractive for a variety of electronic systems. Previously it had been thought that deleting files from flash drives was sufficient to remove sensitive and confidential information from them. However, when performing a deletion operation, many memory systems mark memory pages as unavailable without actually removing or overwriting the data.

Some memory system provide greater security by forcing a program operation on the cells of flash memory during a deletion. However, using various computer forensics techniques, old data may still be recoverable from overwritten flash memory areas. It would be useful to provide a methodology for deleting data from flash memory and other types of memory in a manner that prevents recovery of the deleted data with conventional computer forensic techniques. It would be desirable for such methodology to be low cost and compatible with existing memory systems.

BRIEF DESCRIPTION OF THE DRAWINGS

The disclosure can be better understood with reference to the following drawings. The elements of the drawings are not necessarily to scale relative to each other, emphasis instead being placed upon clearly illustrating the principles of the disclosure. Furthermore, like reference numerals designate corresponding parts throughout the several views.

DETAILED DESCRIPTION

The present disclosure generally pertains to systems and methods for performing analog memory sanitization (secure data deletion) of memory systems or a portion thereof. Simple overwriting of data is not always sufficient for secure and permanent deletion of data from memory. For example, in certain types of memory, such as flash memory, an older zero (i.e., a bit value of zero previously programmed into a memory cell longer ago) has a different analog voltage strength in the memory cell than a newer zero (i.e., a bit value of zero programmed into a memory cell more recently). These differences in charge strength can lead to recoverable data even after the data the memory cells have been overwritten. To more effectively sanitize the data from flash memory to prevent such data recovery, a partial programming operation can be used to overwrite existing data taking into account the relative voltage levels in the memory cells. By taking into account the relative voltage levels, the timing of a partial programming operation can be controlled to provide matched voltage levels in the memory cells so that conventional computer forensic techniques for data recovery are ineffective.

In another embodiment, a special programming operation for sanitizing memory can be performed on a plurality of memory cells to force the charge in the cells to approximately the same voltage level regardless of the respective data value stored in each cell. As an example, each cell may be programmed to a logical high bit value (e.g., a "0") by increasing the charge in each cell to a voltage level that is higher than the voltage level for writing the same logical bit value in a normal programming operation. Thus, after the special programming operation is performed, the voltage levels of cells storing old 0's (i.e., cells storing 0's prior to the programming operation) may be indistinguishable from voltage levels of cells storing new 0's (i.e., cells storing 1's prior to the programming operation such that the programming operation transitions the 1's to new 0's).

Figure 1:
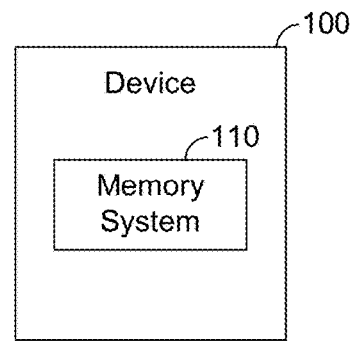
FIG. 1 is a block diagram illustrating an exemplary device with a flash memory.

FIG. 1 is a block diagram illustrating an exemplary device with 100 a memory system 110 for storing data. The device 100 may include, but is not limited to, smartphones, mobile devices, tablets, personal digital assistants, personal computers, game consoles, game cartridges, or other devices, and the memory system 110 may be a memory card, a Universal Serial Bus flash drive, a solid-state drive or other types of memory. In an exemplary embodiment, the memory 110 may be a NAND flash architecture, although in other embodiments other types of devices 100 and other types of memory 110 are possible.

Figure 2:
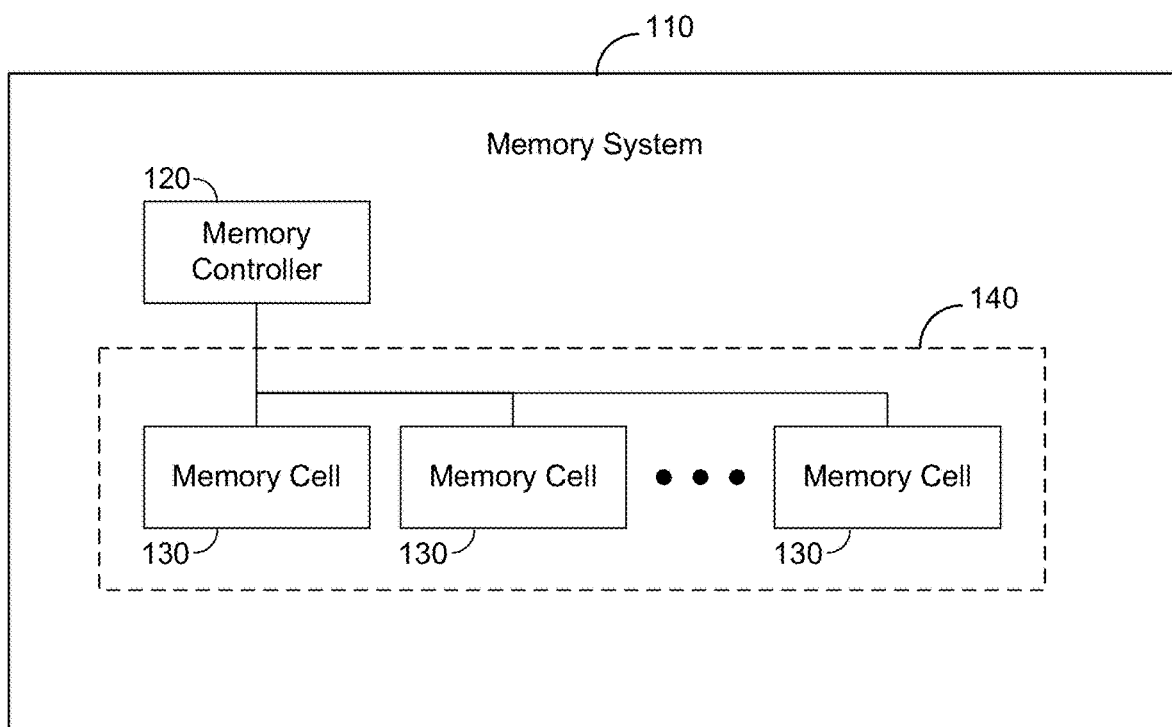
FIG. 2 is a block diagram illustrating an exemplary embodiment of a memory system.

FIG. 2 depicts a memory system 110 having a plurality of memory cells 130. In actuality, the memory system 110 may have any number of memory cells (e.g., from one to a trillion or more), but in FIG. 2 a few memory cells 130 are shown for simplicity of description. The memory cells 130 may be flash memory configured as NOR, NAND, VNAND or other types or arrangements. Unless otherwise indicated, it will be assumed that the memory cells shown by FIG. 2 and described herein are NAND flash memory cells, but it should be emphasized that other types of memory cells are possible (NOR flash, Resistive RAM, Ferroelectric RAM, etc.). In addition, each cell 130 of the memory system 110 may be configured for storing a desired number of charge states (e.g., bits) per cell, such as single level cell (SLC), multi-level cell (MLC), triple-level cell (TLC) or otherwise. The memory cells 130 can be located on one or more memory chips 140. Within some classes of memory chips 140, memory cells are setup in blocks and pages. A page represents the smallest unit that can be programmed to a memory chip 140. A block represents the smallest unit that can be erased from a memory chip 140. In some embodiments, there are multiple pages within each block. Note that, in the context of memory operations, the terms "program" and "write" are synonymous, and these terms shall be used interchangeably herein.

As shown by FIG. 2, the memory cells 130 may be coupled to a memory controller 120 that is configured to perform memory operations, such as reading, erasing, and programming (i.e., writing) on the memory cells 130 similar to other memory controllers known in the art. The memory controller 120 may be implemented in hardware or a combination of hardware and software. As an example, the memory controller 120 may be implemented exclusively in hardware, such as an ASIC, a field programmable gate array, or other type of circuitry configured to perform memory operations. In another example, the memory controller 120 may comprise a processor, such as digital signal processor (DSP) or central processing unit (CPU), that is configured to execute software to perform one or more functions of the memory controller 120. The memory controller 120 may also comprise a clock (not shown) for enabling the memory controller 120 to track or otherwise determine time.

As known in the art, memory operations may be performed by applying specific voltages on connections or "lines," such as word lines and bit lines, connected to one or more memory cells 130 as appropriate for performing the desired operation. In some embodiments, memory cells 130 may be located on one or more memory chips 140 (i.e., an integrated circuit chip with memory), and the memory controller 120 may be on a separate integrated circuit (IC) chip that is electrically coupled to the memory chip 140. The memory controller 120 may transmit to a memory chip 140 a request to perform a memory operation, and the memory chip 140 may perform the requested operation applying voltages as appropriate to the memory cells 130 of the memory chip 140.

Figure 3:
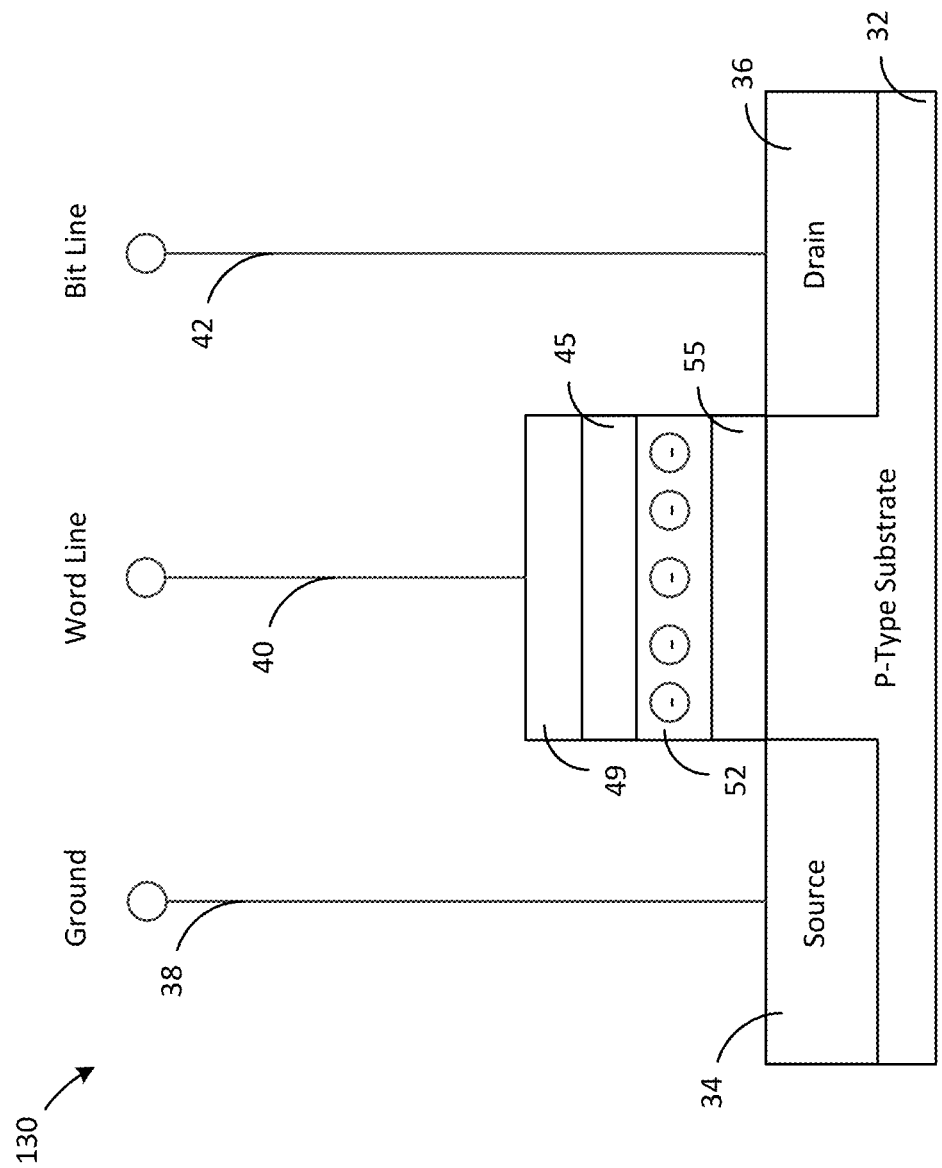
FIG. 3 is a block diagram illustrating an exemplary embodiment of a flash memory cell, such as is depicted by FIG. 2.

Flash memory is generally a type of non-volatile semiconductor memory that stores information in the form of charge on one or more floating gates 52. FIG. 3 depicts an exemplary embodiment of a flash memory cell 130, such as is depicted by FIG. 2. The memory cell 130 of FIG. 2 is depicted as essentially a standard flash memory cell and has a substrate 32, source 34, drain 36, ground line 38, word line 40, and bit line 42. The memory cell 130 has a blocking oxide 45 below the control gate 49 and tunnel oxide 55 below the floating gate 52. Voltage may be applied to the cell 130 via the lines 38, 40, 42 to perform read/erase/program operations. Structurally, a flash memory cell 130 comprises a floating gate metal-oxide-semiconductor field effect transistor (FG-MOSFET), which allows electrons from the silicon substrate 32 to be tunneled into the floating gate 52 during the program operation (e.g., by applying a large positive charge differential across the control gate 49 and the substrate 32), thereby increasing the charge in the floating gate 52. The erasure operation uses tunneling to remove electrons from the floating gate 52 to the substrate 32 (e.g., by applying a large negative charge differential across the control gate 49 and the substrate 32), thereby removing charge from the floating gate 52.

Figure 4:
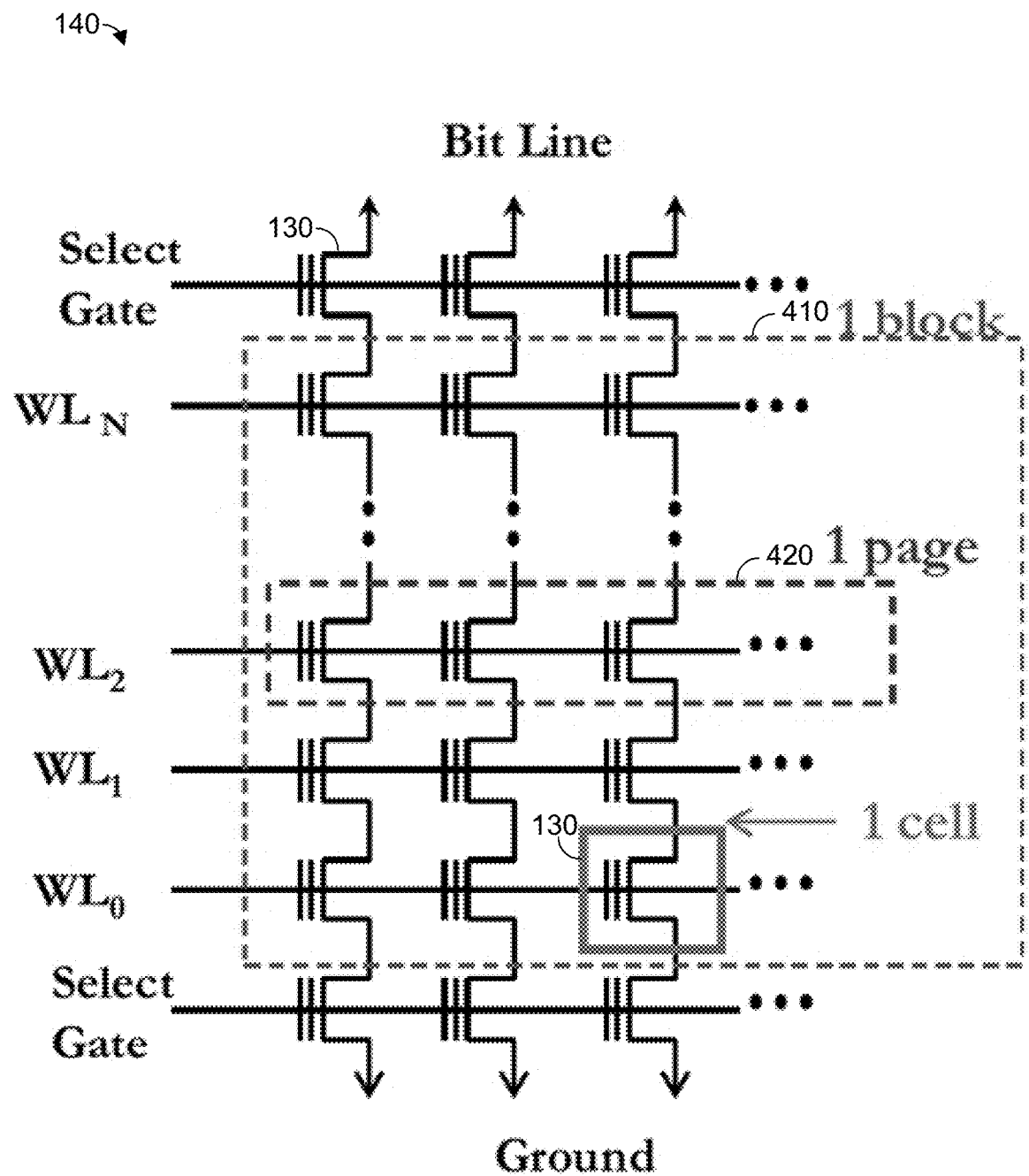
FIG. 4 is a diagram illustrating an exemplary NAND flash memory array of a memory chip depicted in FIG. 2 using cells depicted in FIG. 3.

FIG. 3 depicts a memory cell 130 of a memory chip 140, and FIG. 4 depicts an exemplary NAND flash memory array of memory cells 130. Flash memory chips 140 are generally arranged in one or more blocks 410. Each block 410 generally contains one or more pages 420 (e.g., a block may contain 32 pages). Each page generally holds one or more memory cells 130 representing bits (e.g., a page may contain 512 to 16 K memory cells plus additional cells for error correction). The values stored in memory cells 130 are changed through operations generally referred to as erasing and programming.

The erase operation in NAND flash typically involves setting a high voltage on the substrate 32 and a low voltage on all the control gates 49 of the block 410 causing electron tunneling from the floating gate 52. An erase operation often forces the bit value in a memory cell 130 to a logical high value (e.g., a "1"). Performance of the erase operation typically erases each memory cell 130 of the block being erased.

The program operation in NAND flash typically involves setting a high voltage on selected control gates 49 of the memory cells 130 of the page to be programmed and a low voltage on the substrate 32. This voltage differential causes electron tunneling to the floating gate 52 of the memory cells 130 to be programmed and not the other memory cells 130 of the page. Controlling the voltage on selected bit lines 42 and word lines 40 affects which page and memory cells 130 of a page 420 are programmed. A program operation often forces the bit value in a memory cell 130 being programmed to a logical low value (e.g., a "0"). During the programming operation, only the set of memory cells 130 to which a high gate voltage is applied are forced to the logical low bit value (e.g., from one "1" to zero "0"), and the values in the remaining memory cells 130 remain unchanged.

Generally, a block 410 is not erased every time a page it contains is deleted. Instead, the deleted pages are marked as invalid page addresses. Some conventional memory controllers may attempt to erase or overwrite data to be deleted in an effort to remove the data from the memory chip. As an example, a memory controller may erase memory cells by controlling the voltages of their control gates 49 so that charge is substantially removed from the floating gates 52. Thus, the data values in cells that are storing a logical low bit value (e.g., a "0") are transitioned to a logical high bit value (e.g., a "1") so that all of the memory cells storing the data to be erased by the erase operation should be at a logical high bit value after the erase operation regardless of the data values in the cells prior to the erase operation. However, many memory systems are designed so that an erase operation can only be performed on a block of memory, and the pages within a block cannot be individually erased without erasing the entire block.

Some memory systems are designed to address this issue by using a program operation rather than an erase operation to delete data. That is, a memory system may be configured to delete data by writing a string of logical low bit values (e.g., "0's") to all of the cells. However, even though each cell is at a logical low bit value after such a programming operation, the analog voltage levels in the cells may be slightly different depending on when each respective cell was transitioned to a logical low value (e.g., a "0"). That is, the analog voltage level in each cell after the programming operation may depend on the data value stored in the cell prior to the programming operation, as will be explained in more detail below.

In this regard, the charge stored on the floating gates 52 of programmed flash memory cells 130 experience voltage leakage over time. As a result, the memory cells storing the zero bits (i.e., logical low bit values) in the original data lose a portion of the stored charge over time giving it a lower threshold voltage $V_t$. These older zero bits associated with more charge loss shall be referred to hereafter as "weak zeros" or "weak 0's." Newer zero bits associated with less charge loss due to more recent programming shall be referred to hereafter as "strong zeros" or "strong 0's."

Figure 5:
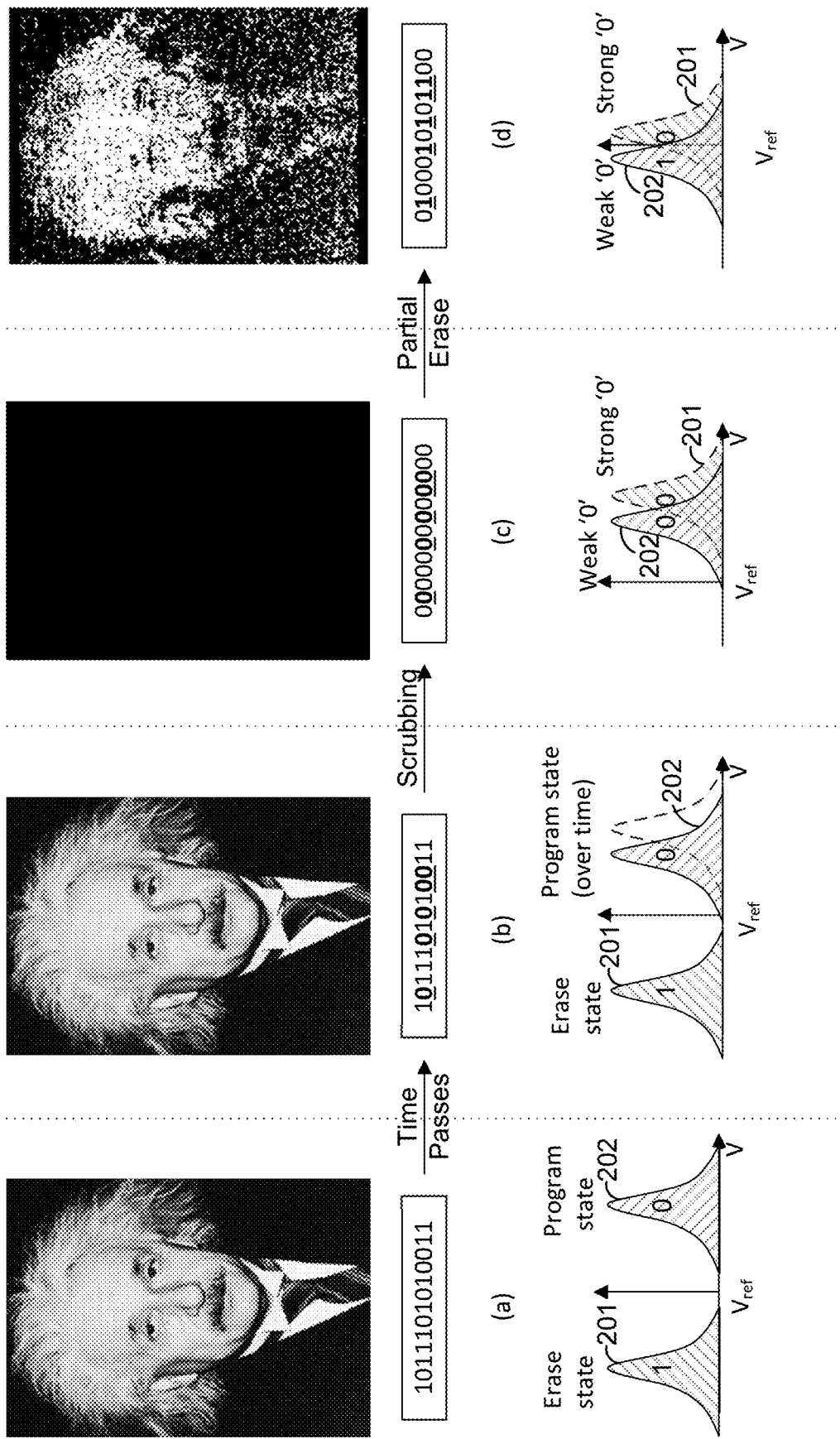
FIG. 5 illustrates a process of data recovery from a scrubbed flash memory as depicted by FIG. 4.

FIG. 5a shows a voltage distribution for charge levels in memory cells storing data, such as data defining an image of Einstein. Some of the memory cells are in an erase state and store a logical high value (e.g., a binary "1"). The other cells are in a program state and store a logical low value (e.g., a binary "0"). The curve 201 in FIG. 5a represents the voltage distribution for the memory cells in the erase state, and the curve 202 in FIG. 5a represents the voltage distribution for the memory cells in the program state. $V_{ref}$ refers to the reference voltage applied to the memory cells 130 for comparison to the stored charge levels to determine whether a binary "1" or "0" is stored in the cell. Since the voltage levels for the memory cells 130 in the erase state (i.e., represented by curve 201) are lower than $V_{ref}$ the bit values read from these memory cells should be a binary "1." Since the voltage levels for the memory cells 130 in the program state (i.e., represented by curve 202) are greater than $V_{ref}$ the bit values read from these memory cells 130 should be a binary "0."

Over time, charge leakage slightly lowers the voltage levels (i.e., the amounts of charge) in the memory cells 130 represented by curve 202, as shown by FIG. 5b. Thus, the curve 202 shifts slightly to the left along the horizontal axis, as shown by FIG. 5b, indicating that each memory cell 130 in the program state stores less charge than at the time that the memory cell 130 was first programmed with a logical low value.

At some point, the image may be deleted, and this deletion may be performed by overwriting the memory cells 130 represented by curve 201 with a logical low value so that all memory cells 130 (i.e., those represented by curve 201 and those represented by curve 202) store a bit value of "0," as shown by FIG. 5c. However, the memory cells 130 represented by curve 201 have been newly programmed and thus have greater voltage levels than the memory cells 130 represented by curve 202, which have been affected by charge leakage. The bit values in the memory cells 130 represented by curve 201 are "strong zeros" since they are at higher analog voltages than the bit values in the memory cells 130 represented by curve 202. These bit values in the memory cells 130 represented by curve 202 are "weak zeros" since they are at lower voltages due to charge leakage that has occurred since these memory cells 130 were last programmed.

Figure 6:
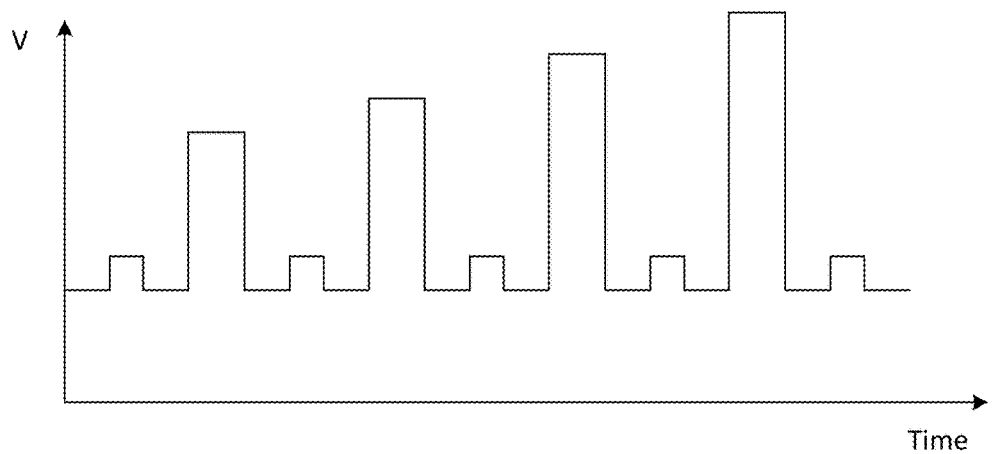
FIG. 6 is graph illustrating voltages applied to a control gate of a memory cell for performing a programming operation.
Figure 7:
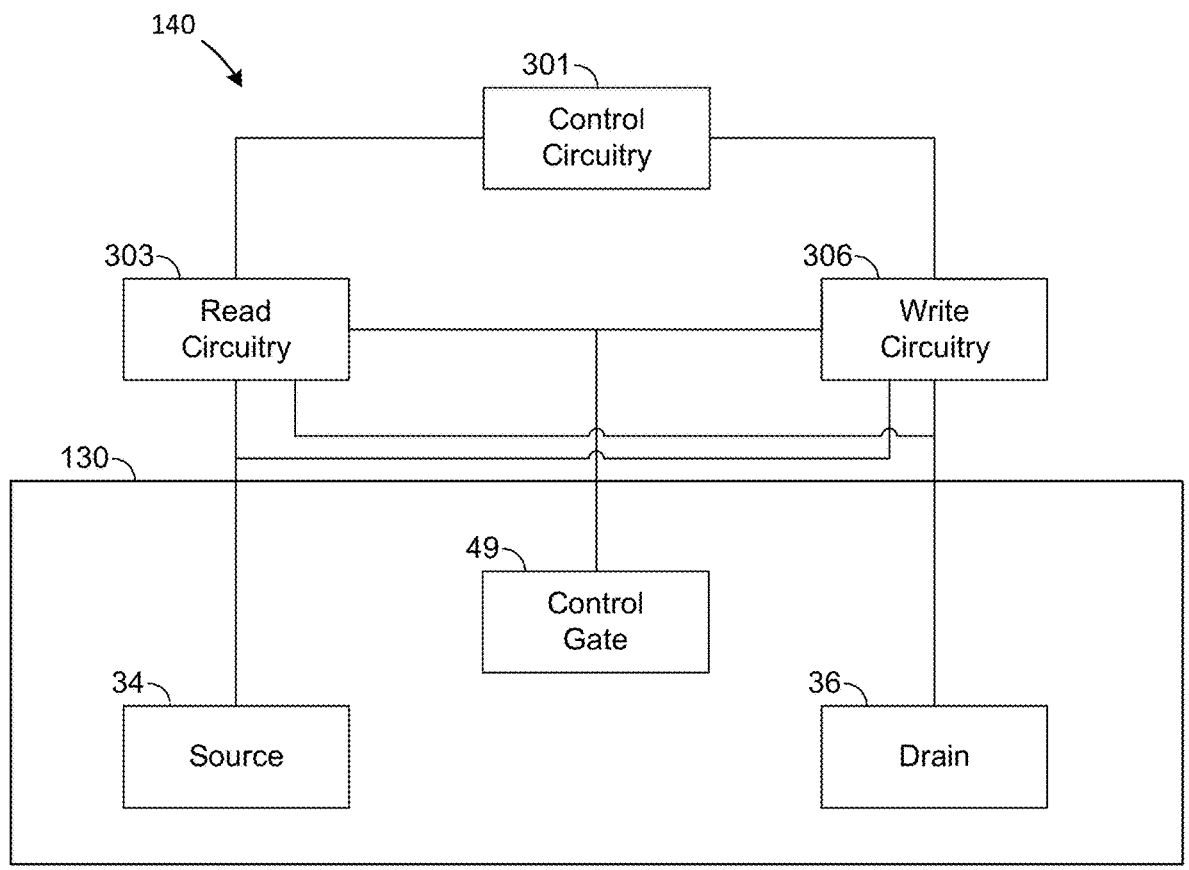
FIG. 7 is a block diagram illustrating an exemplary embodiment of circuitry within a memory chip, such as is depicted by FIG. 2.

To help illustrate this difference in voltage levels, refer to FIG. 6, which shows the voltages applied to the control gate 49 of a memory cell 130 during a programming operation. Also, FIG. 7 shows an embodiment of circuitry of the memory chip 140 that applies the voltages shown by FIG. 6. In this regard, the memory chip 140 comprises control circuitry 301 that is configured to control write and read operations in response to commands from the memory controller 120 (FIG. 2). As shown by FIG. 7, the memory chip 140 also comprises read circuitry 303 that is configured to read the value stored in the cell 130 and write circuitry 306 that is configured to write a value to the cell 130.

Note that any of the circuitry 301, 303, 306 may be implemented in hardware or a combination of hardware and software. As an example, any of the circuitry may be implemented as a field programmable gate array (FPGA) or application specific integrated circuit (ASIC). Any of the circuitry may include a processor, such as a digital signal processor, that is programmed with and configured to execute software. Other types of circuitry are possible in other embodiments.

When a logical low bit value (e.g., a "0") is to be written to a cell, the write circuitry 306 is configured to apply a series of voltage pulses 312, referred to hereafter as "write pulses," to the control gate 49. The voltage of each successive write pulse is increased, as shown by the increasing pulse amplitudes of the write pulses 312 in FIG. 6. Each write pulse, forces an amount of charge into the floating gate 52, thereby increasing the analog voltage level of the floating gate 52. Further, as the amplitudes of the write pulses 312 are increased, a greater amount of charge is forced into the floating gate 52 for each write pulse 312.

In between each write pulse 312, the read circuitry 303 reads the data value stored in the cell 130. This may be performed by applying a pulse 317, referred to hereafter as "normal read pulse," of $V_{ref}$ (which is less than the voltages of the write pulses 312) to the control gate 49 and then determining whether the path between the source 34 and drain 36 is conductive. That is, the read circuitry 303 determines whether a logical high bit value or a logical low bit value is stored in the cell 130 based on whether the path is determined to be conductive. If a logical high bit value is read, the write circuitry 303 continues to apply write pulses 312 of increasing amplitude. Once the read circuitry 303 reads a logical low bit value after a write pulse, the process of applying the write pulses 312 is stopped, and the program operation is deemed to be completed.

Notably, when the cell 130 is storing a logical low bit value (e.g., a "0) prior to the programming operation, the write circuitry 306 does not apply any write pulses 312 because the cell 130 is already in the desired programmed state. Thus, during a normal program operation, write pulses 312 are only applied to the cells 130 having a voltage level below $V_{ref}$ such that the voltage level of a cell 130 already storing a logical low bit value is not increased by the programming operation. Further, the voltage level of each cell 130 storing a logical high bit value is increased up to the point where the voltage level exceeds $V_{ref}$ thereby transitioning the value in the cell to a logical low bit value (e.g., a "0"). Thus, due to charge leakage, the voltage levels in cells 130 already storing a logical low bit value (e.g., a weak 0) may be less than the voltage levels of the cells 130 that are transitioned from a logical high bit value to a logical low bit value (e.g., a strong 0).

Referring again to FIG. 5d, the voltage differences between the weak zeros and the strong zeros after performance of the programming operation may be used to recover at least a portion of the original data defining the image even though this data has been deleted by programming the memory cells 130 represented by curve 201. As an example, $V_{ref}$ may be changed for a read operation such that it is between the peaks of the curves 201 and 202, as shown by FIG. 5d. By so adjusting the reference voltage, at least some of the weak zeros may be distinguished from the strong zeros using read operations so that the deleted data is recoverable. That is, if the voltage applied to the control gate 49 during a read operation is increased to a new $V_{ref}$ between the voltages of strong 0's and weak 0's, then the cells 130 with weak 0's will be read a logical high bit value (e.g., a "1") whereas the cells 130 with strong 0's will be read as a logical low bit value (e.g., a "0).

In other examples, the data may be recovered without adjusting the reference voltage. As an example, a partial erase operation may be performed to reduce the voltages of curves 201 and 202 so that $V_{ref}$ is substantially between the curves 201 and 202, similar to FIG. 5d. In such example, similar techniques may be used to read the memory cells 130 and recover the originally stored data that has been deleted.

In some embodiments, the memory system 110 is configured to overwrite data in a manner that prevents the data from being successfully recovered using the aforementioned data restoration techniques. In this regard, when the memory controller 120 performs a memory operation for writing data to group of memory cells 130, such as in response to request to delete or erase data previously stored in the memory cells 130, the memory controller 120 is configured to perform the write operation so that the analog voltage levels in all of the memory cells 130 substantially match once the write operation is complete. Note that the use of "substantially" is a recognition that the voltage levels do not need to precisely match and some differences in the voltage levels are acceptable as long as the differences are small enough to prevent data previously stored in the memory cells prior to the write operation from being successfully restored.

In order to ensure that the voltage levels in the memory cells 130 substantially match after performance of the write operation, the memory controller 120 is configured to determine a value that is indicative of the amount of voltage leakage that has occurred in the memory cells 130 that are not affected by the write operation. As an example, as described above, when data in a memory chip 140 is to be deleted, some of the data corresponds to logical low values (e.g., 0's), and the memory cells 130 storing these 0's shall be referred to hereafter as "weak zero cells." The remaining data corresponds to logical high values (e.g., 1's), and the memory cells storing these 1's shall be referred to hereafter as "strong zero cells." In FIG. 5a, the voltage distribution of the weak zero cells 130 may be represented by curve 202, and the voltage distribution of the strong zero cells 130 may be represented by curve 201 (noting that the data value in the strong zero cells 130 is actually a logical high value (e.g., 1) prior to the write operation). In this example, the charge levels in the weak zero cells 130 corresponding to curve 202 are not affected by the write operation for the reasons described above. Thus, in performing the write operation, the memory controller 120 is configured to determine a value, referred to hereafter as leakage value, indicative of the amount of voltage or charge leakage that has occurred in these weak zero cells 130 since these cells 130 were last programmed with a bit value of 0. Based on this value, the memory controller 120 is configured to control the write operation such that the voltage levels in the strong zero cells 130 being programmed by the write operation substantially match the voltage levels in the weak zero cells 130, as will be described in more detail below.

There are various techniques that may be used to determine the leakage value. In some embodiments, the leakage value is a time value that indicates the amount of time that has elapsed since the weak zero cells 130 were last programmed. In this regard, the amount of voltage leakage is generally proportional to the amount of time that has elapsed since programming, and such a time value thus indicates an amount of leakage loss that has occurred to the charge levels in the weak zero cells 130.

To enable the memory controller 120 to determine such a leakage value, the memory controller 120 (at the time of programming the weak zero cells 130 corresponding to curve 202 with a bit value of 0 in a previous write operation) is configured to store in memory (e.g., one or more registers or other forms of memory) information indicative of the time of performance of such previous write operation. As an example, such information may be a timestamp indicating an approximate time that this previous write operation occurred. When the memory controller 120 performs the current write operation on the strong zero memory cells 130 corresponding to curve 201 in order to delete or erase the data stored in the memory cells 130, the memory controller 120 is configured to retrieve the time information associated with the previous write operation and compare (e.g., subtract) it to the current time to determine the leakage value, which indicates the amount of time that has elapsed since the previous write operation and thus the amount of voltage or charge that has leaked from the weak zero cells 130. The memory controller 120 then uses this leakage value to control the current write operation such that the analog voltage levels in the strong zero memory cells 130 substantially match the analog voltage levels in the weak zero memory cells 130. This process of substantially matching such voltage levels is referred to as "analog sanitization" as it sanitizes the memory system 110 of the data being overwritten at the analog or voltage level within the memory system 110 such that the data cannot be restored from the voltage levels in the memory cells 130.

There are various techniques that the memory controller 120 can use to ensure that voltage levels in the strong zero cells 130 and the weak zero cell 130 substantially match after performance of the current write operation. In some embodiments, the memory controller 120 performs a partial write operation rather than a full write operation and controls the timing of the partial write operation such that it ends when the voltages in the strong zero memory cells 130 substantially match the voltages in the weak zero memory cells 130.

In this regard, a full write operation takes a finite amount of time. As a full write operation is performed on the strong zero cells 130 corresponding to the curve 201, the voltage in the strong zero cells 130 is increased such that the curve 201 begins moving to the right along the horizontal axis in FIG. 5a. If the full write operation is allowed to run to completion, then the curve 201 would effectively move past the curve 202 representative of the weak zero cells 130, noting that this curve 202 has moved slightly to the left along the horizontal axis over time due to charge leakage. In this regard, if the full write operation is allowed to progress to completion, then there would be voltage difference between the weak zero cells 130 and the strong zero cells 130, as indicated by FIG. 5c. and described above. However, in the instant embodiment, the memory controller 120 does not allow the write operation to fully complete but rather performs a partial write operation such that the operation terminates before the strong value cells 130 are fully charged. Specifically, the timing of the write operation is controlled such that the partial write operation is terminated when the peak of the curve 201 substantially matches the peak of the curve 202 so that there is not a significant voltage difference between the weak zero cells 130 and the strong zero cells 130.

To perform the partial write operation, the memory controller 120 may transmit a program request for requesting the memory chip 140 to write a zero bit value in the strong zero cells 130, as the memory controller 120 would do for a full write operation. In response, the memory chip 140 applies voltages to the strong zero memory cells 130 so that the charge levels in these cells 130 begin to increase. However, before the write operation is fully completed, the memory controller 120 sends another request to the memory chip 140 for stopping or interrupting the write operation being performed. As an example, the memory controller 120 may send a conventional reset request, which causes a reset at the memory chip 140 thereby stopping the memory chip 140 from continuing with the write operation. In other embodiments, other types of requests may be sent by the memory controller 140 to stop the write operation.

Based on the leakage value, the memory controller 120 determines when to send the reset request (or other request for stopping the write operation) so that the write operation is stopped when the voltage levels in the strong zero memory cells 130 have approximately reached the voltage levels in the weak zero memory cells 130. In this regard, the timing of the reset request is inversely proportional to the leakage value. That is, for a larger leakage value (indicating that a greater amount of time has elapsed since programming of the weak zero cells 130 and, thus, indicating a greater amount of leakage loss), the memory controller 120 waits less time since initiation of the current write operation before sending the request to stop the current write operation. Conversely, for a smaller leakage value (indicating that a less amount of time has elapsed since programming of the weak zero cells 130 and, thus, indicating a smaller amount of leakage loss), the memory controller 120 waits more time since initiation of the current write operation before sending the request to stop the current write operation. In any event, the timing of the reset request (or other request for stopping the current write operation) is controlled based on the leakage value so that the current write operation is stopped once the voltage levels in the strong zero cells 130 being programmed substantially match the voltage levels in the weak zero cells 130 that are unaffected by the current write operation.

Figure 8:
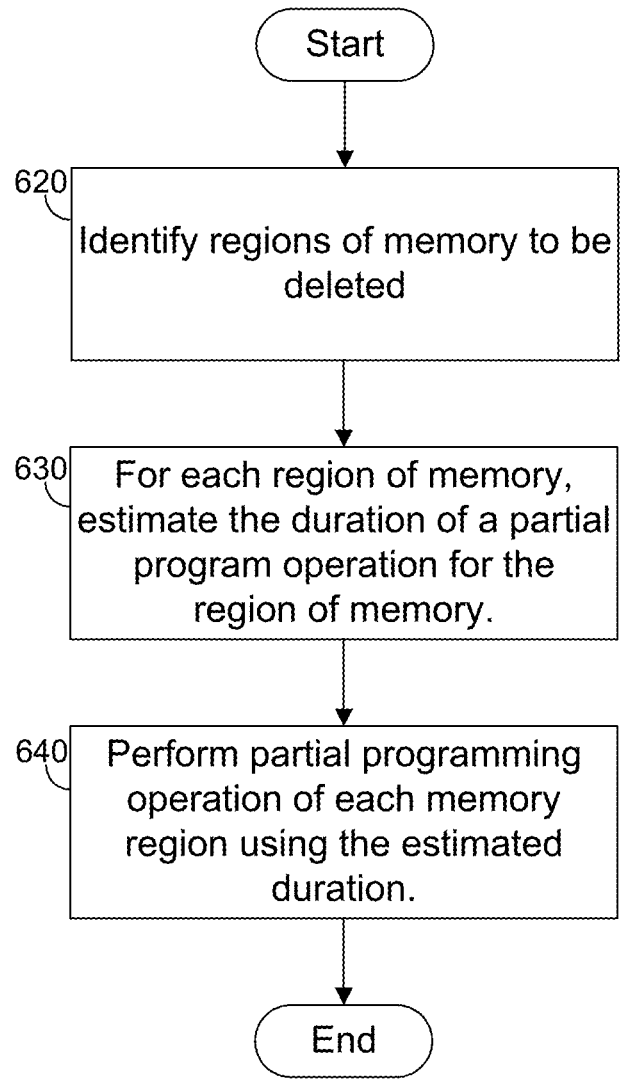
FIG. 8 is flowchart illustrating an exemplary process of analog scrubbing of a flash memory, such as is depicted by FIG. 4.

To better illustrate the foregoing, an exemplary use of the memory system 110 to delete stored data will be described with particular reference to FIG. 8. At step 620, the memory controller 120 identifies the memory regions affected by a requested deletion operation (e.g., identifying a set of physical pages affected). In some embodiments, this identification is performed by receiving a list of affected memory locations (e.g., pages). In some embodiments, this identification involves looking up logical or physical locations from file system records of files to be deleted and calculating the memory locations affected. At step 630, for each memory region to be deleted, the memory controller 120 estimates the duration of the partial programing operation needed to sanitize the region (e.g., how long it would take for a partial programming operation to change existing ones 1's to zeros 0's to the voltage levels of existing zeros 0's for that memory region). In some embodiments, this involves identifying or estimating the age of existing data stored in the region to be deleted (e.g., the existing zeros 0's). As described above, this age can be calculated by comparing the current time to the time that the existing data was previously written to the memory chip 140.

At step 640, the memory controller 120 performs a partial programing of each of the identified memory regions for the estimated duration for the respective region. In some embodiments, a partial program operation is performed by issuing a normal programming operation followed by a reset or disrupt request before the program operation has been completed to shorten the program operation to the estimated duration for the particular memory region. In some embodiments, a partial program operation may be performed by issuing a program request along with a program time specifying a shortened time to perform the requested program operation.

In other embodiments, other techniques may be used to make the voltage levels in memory cells 130 substantially equal to prevent hackers from distinguishing weak 0's from strong 0's. As an example, in some embodiments, a memory chip 140 may be configured to perform a special programming operation for sanitizing a plurality of memory cells by forcing the cells to approximately the same voltage level. Such programming operation may be performed on any number of cells, such as a page of cells fewer in number than a block of cells that can be erased by an erase operation.

Figure 9:
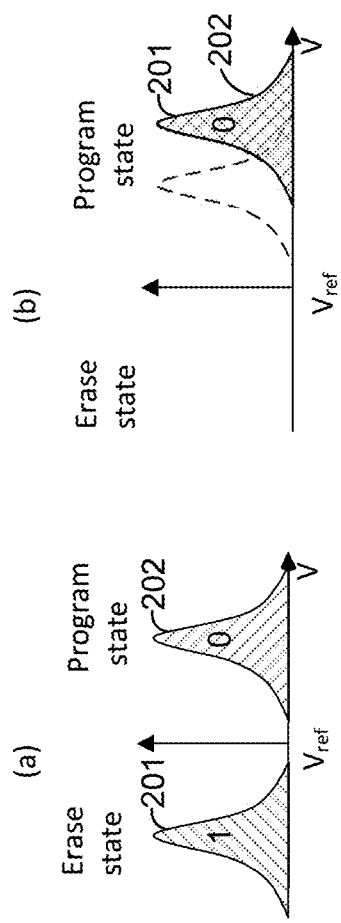
FIG. 9 illustrates exemplary voltage distributions of memory cells in performance of an overwrite operation for sanitizing the cells.

In some embodiments, the special programming operation, referred to hereafter as an "overwrite operation," is designed to write a logical low bit value (e.g., a "0") to each cell 130 storing a value of the data to be deleted. However, the reference voltage $V_{ref}$ that is used to control the write operation is changed to a greater value $V_{high}$ so that each cell 130 is forced to a greater voltage level than the voltage level for a normal write operation, as shown by FIG. 9. In this regard, FIG. 9a shows the voltage distributions of the cells 130 prior to the overwrite operation, and FIG. 9b shows the voltage distributions after performance of the overwrite operation.

As shown by FIG. 9a, each cell 130 in the erase state (e.g., storing a logical high bit value) prior to the overwrite operation (referred to hereafter as an "old 1 cell") has an analog voltage level below $V_{ref}$ which is the reference voltage applied to the control gates 49 of the cells 130 during normal read operations. Each cell 130 in the program state (e.g., storing a logical low bit value) prior to the overwrite operation (referred to hereafter as an "old 0 cell") has an analog voltage level above $V_{ref}$. During the overwrite operation, charge is forced into the floating gate 52 of each old 0 cell to increase the analog voltage level of the cell's floating gate 52, as can be seen by comparing FIG. 9b to FIG. 9a. In this regard, the dotted curve in FIG. 9b represents the voltage distribution of the old 0 cells prior to the overwrite operation being performed. As can be seen in FIG. 9b, curve 202 representing the voltage distribution of the old 0 cells moves right relative to FIG. 9a indicating that the analog voltage level in each old 0 cell has been increased by the overwrite operation. Thus, the floating gate voltages of the old 0 cells are forced to a greater level for the overwrite operation relative to a normal write operation.

In addition, charge is similarly forced into the floating gate of each old 1 cell to increase the analog voltage level of the cell's floating gate 52 to approximately the same level as the old 0 cells, as shown by FIG. 9b. In this regard, the curve 201 representing the voltage distribution of the old 1 cells moves right relative to FIG. 9a indicating that the analog voltage level in each old 1 cell has been increased by the overwrite operation. In fact, the curve 201 substantially overlaps with curve 202 indicating that the voltage levels of both old 1 cells and old 0 cells are about the same, thereby preventing recovery of the data stored in the cells 130 prior to the overwrite operation.

Note that there are various techniques that can be used to force the floating gate voltages of old 1 cells and old 0 cells to substantially the same levels. In one embodiment, this is achieved by using a voltage $V_{high}$ that is greater than the voltage $V_{ref}$. In this regard, when the control circuitry 301 receives a command to delete data from a page or other number of cells 130, the memory chip 140 may be configured to write a logical low bit value (e.g., a "0") to each of the cells 130 storing data to be deleted in the same way as described above with reference to FIG. 6. However, rather than applying the same reference voltage $V_{ref}$ used for normal read operations for the read pulses 317 of FIG. 3, the read circuitry 303 is instead configured to apply a greater voltage $V_{high}$ for these read pulses 317.

Such voltage $V_{high}$ may be selected to be greater than the voltage levels of the floating gates 49 in the old 0 cells prior to the overwrite operation. As a result, the write circuitry 306 will continue to apply successively greater write pulses 312 until voltage levels are reached that exceed the voltage levels of the old 0 cells prior to the overwrite operation. Thus, by increasing the reference voltage applied to the control gates 49 for the read pulses 317 during performance of the overwrite operation, both the old 0 cells and old 1 cells are forced to about the same analog voltage level, which is greater than the analog voltage level associated with a normal program operation.

For illustrative purposes, assume that it is desirable to delete the data of a page of memory. In such a case, the memory controller 120 (FIG. 2) may transmit a command for deleting the page to the memory chip 140 having the memory cells 130 of the page. In response, the control circuitry 310 (FIG. 7) may control the read circuitry 303 and the write circuitry 306 to program all of the cells 130 of the page identified by the delete command using a special overwrite operation for sanitizing the page. In other words, the memory chip 140 may write a 0 to each cell 130 of the identified page using the special overwrite operation.

In performing this special overwrite operation, the memory chip 140 functions in the same way as a normal program operation except that the read circuitry 303 when reading a given cell via the read pulses 317 shown by FIG. 6 is configured to apply a voltage $V_{high}$ that is greater than the voltage $V_{ref}$ normally used for the pulses 317 during normal program operations and normal read operations. As a result of this voltage difference, the memory chip 140 will operate so as to stop applying the write pulses 312 only after a greater voltage level (relative to normal program operations) is reached. Thus, each cell 130 of the identified page is forced to a greater voltage level that is the same for all of the page's cells 130, including both old 0 cells and old 1 cells. Therefore, each cell 130 of the page should have substantially the same analog voltage level such that a hacker should be unable to recover the data previously stored to the cells 130 of the page prior to the special overwrite operation.

Notably, the special overwrite operation enables an amount of memory smaller than a block to be sanitized as may be desired. Thus, this analog sanitization may be performed as needed or desired without having to move or otherwise process other data in the same block that is not to be deleted.

The data sanitizing systems and methods described above may be used in the context of sanitizing NAND flash memory or other types of memory that allow for partial programming operations. In some embodiments and memory technologies, partial erase and program operations may be swapped to perform similar functions.

The foregoing is merely illustrative of the principles of this disclosure and various modifications may be made by those skilled in the art without departing from the scope of this disclosure. The above-described embodiments are presented for purposes of illustration and not of limitation. The present disclosure also can take many forms other than those explicitly described herein. For instance, the order of particular steps or the form of particular processes can be changed in some cases to perform equivalent steps. Accordingly, it is emphasized that this disclosure is not limited to the explicitly disclosed methods, systems, and apparatuses, but is intended to include variations to and modifications thereof, which are within the spirit of the following claims.

As a further example, variations of apparatus or process parameters (e.g., dimensions, configurations, components, process step order, etc.) may be made to further optimize the provided structures, devices and methods, as shown and described herein. In any event, the structures and devices, as well as the associated methods, described herein have many applications. Therefore, the disclosed subject matter should not be limited to any single embodiment described herein, but rather should be construed in breadth and scope in accordance with the appended claims.

Now, therefore, the following is claimed:

1. A memory system, comprising:
memory having a plurality of memory cells; and
circuitry for reading from and writing to the plurality of memory cells, the circuitry configured to program at least one of the plurality of memory cells to a logical bit value in a first programming operation for writing data to the plurality of memory cells by successively applying a first plurality of pulses to the at least one memory cell until an analog voltage level of the at least one memory cell exceeds a first reference voltage corresponding with the logical bit value such that the at least one memory cell indicates the logical bit value when the analog voltage level exceeds the first reference voltage, the circuitry further configured to program each of the plurality of memory cells to the logical bit value in a second programming operation for sanitizing the plurality of memory cells by successively applying a second plurality of pulses to each of the memory cells until an analog voltage level of the respective memory cell exceeds a second reference voltage that is greater than the first reference voltage.

2. The memory system of claim 1, wherein the circuitry is configured to apply the first plurality of pulses to a control gate of the at least one memory cell, and wherein circuitry is configured to apply the first reference voltage to the control gate for reading the at least one memory cell between successive pulses of the first plurality of pulses.

3. The memory system of claim 2, wherein the circuitry is configured to apply the second plurality of pulses to the control gate, and wherein circuitry is configured to apply the second reference voltage to the control gate for reading the at least one memory cell between successive pulses of the second plurality of pulses.

4. A memory system, comprising:
memory having at least one memory cell; and
circuitry for reading from and writing to the memory cell, the circuitry configured to program the memory cell to a logical bit value in a first programming operation by successively applying a first plurality of pulses to a control gate of the memory cell until an analog voltage level of the at least one memory cell exceeds a first reference voltage corresponding with the logical bit value such that the at least one memory cell indicates the logical bit value when the analog voltage level exceeds the first reference voltage, wherein each of the first plurality of pulses causes charge to flow to a floating gate of the memory cell thereby increasing the analog voltage level of the memory cell, the circuitry configured to perform the first programming operation by applying the first reference voltage for reading the memory cell between successive pulses of the first plurality of pulses, the circuitry configured to program the memory cell to the logical bit value in a second programming operation for sanitizing at least a portion of the memory by successively applying a second plurality of pulses to the control gate of the memory cell until the analog voltage level of the at least one memory cell exceeds a second reference voltage, wherein each of the second plurality of pulses causes charge to flow to the floating gate of the memory cell thereby increasing the analog voltage level of the memory cell, the circuitry configured to perform the second programming operation by applying the second reference voltage for reading the memory cell between successive pulses of the second plurality of pulses, wherein the second reference voltage is greater than the first reference voltage.

5. A method for use in a memory system, comprising:
programming at least one of a plurality of memory cells of the memory system to a logical bit value in a first programming operation for writing data to the plurality of memory cells;
applying, to a control gate of at least one of the plurality of memory cells, a first reference voltage corresponding with the logical bit value such that the at least one of the plurality of memory cells indicates the logical bit value when an analog voltage level of the at least one of the plurality of memory cells exceeds the first reference voltage, wherein the programming in the first programming operation comprises successively applying a first plurality of pulses to the control gate until the analog voltage level of the at least one of the plurality of memory cells exceeds the first reference voltage;
programming each of the plurality of memory cells to the logical bit value in a second programming operation for sanitizing the plurality of memory cells; and
applying a second reference voltage to the control gate, wherein the programming in the second programming operation comprises successively applying a second plurality of pulses to the control gate until the analog voltage level of the at least one of the plurality of memory cells exceeds the second reference voltage, and wherein the second reference voltage is greater than the first reference voltage.

6. The method of claim 5, wherein the applying the first reference voltage comprises applying the first reference voltage to the control gate for reading the at least one of the plurality of memory cells between successive pulses of the first plurality of pulses.

7. The method of claim 6, wherein the applying the second reference voltage comprises applying the second reference voltage to the control gate for reading the at least one of the plurality of memory cells between successive pulses of the second plurality of pulses.

* * * * *